United States Patent
Lin et al.

(10) Patent No.: US 7,057,276 B2
(45) Date of Patent: Jun. 6, 2006

(54) SEMICONDUCTOR PACKAGE WITH HEAT SINK

(75) Inventors: Chang-Fu Lin, Taichung (TW);
Han-Ping Pu, Taichung (TW);
Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/690,921

(22) Filed: Oct. 21, 2003

(65) Prior Publication Data

US 2004/0251538 A1 Dec. 16, 2004

(30) Foreign Application Priority Data

Jun. 11, 2003 (TW) .............................. 92115797 A

(51) Int. Cl.
*H01L 23/10* (2006.01)
*H01L 23/34* (2006.01)

(52) U.S. Cl. ...................... 257/707; 257/706; 257/704

(58) Field of Classification Search ................ 257/706, 257/707, 704, 778; 438/122
See application file for complete search history.

(56) References Cited

U.S. PATENT DOCUMENTS

| | | | |
|---|---|---|---|
| 5,311,402 A | 5/1994 | Kobayashi et al. | 361/760 |
| 5,637,920 A | 6/1997 | Loo | 257/700 |
| 5,889,323 A * | 3/1999 | Tachibana | 257/704 |
| 5,907,474 A | 5/1999 | Dolbear | 361/705 |
| 5,956,576 A * | 9/1999 | Toy et al. | 438/125 |
| 6,008,536 A * | 12/1999 | Mertol | 257/704 |
| 6,188,578 B1 | 2/2001 | Lin et al. | 361/717 |
| 6,218,730 B1 * | 4/2001 | Toy et al. | 257/704 |
| 6,376,907 B1 | 4/2002 | Takano et al. | 257/704 |
| 6,534,860 B1 * | 3/2003 | Turner | 257/718 |
| 6,538,320 B1 * | 3/2003 | Tosaya et al. | 257/706 |

OTHER PUBLICATIONS

"Challenges in High Yield, Fine Pitch Solder Ball Attachment", by Ivy Qin, et al., SEMI—Semicon Singapore—Semiconductor Packaging Conference, pp. 1-10, May, 2001.

* cited by examiner

*Primary Examiner*—S. V. Clark
(74) *Attorney, Agent, or Firm*—Peter F. Corless; Steven M. Jensen; Edwards Angell Palmer & Dodge, LLP

(57) ABSTRACT

A semiconductor package with a heat sink is provided. At least one chip and a heat sink attached to the chip are mounted on a substrate. At least one slot is formed through at least one corner of the heat sink at a position attached to the substrate. An adhesive material is applied between the heat sink and substrate and over filled in the slot with an overflow of the adhesive material out of the slot. The adhesive material over filled in the slot provides an anchoring effect and increases its contact area with the heat sink to thereby firmly secure the heat sink on the substrate. Further, the slot formed at the corner of the heat sink can alleviate thermal stresses accumulated at the corner of the heat sink and thereby prevent delamination between the heat sink and the substrate.

17 Claims, 4 Drawing Sheets

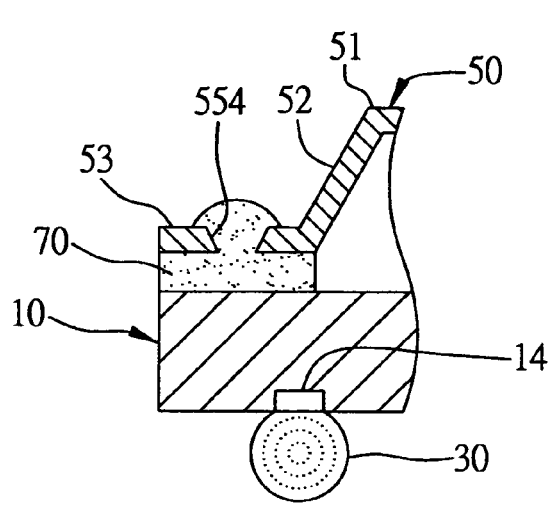
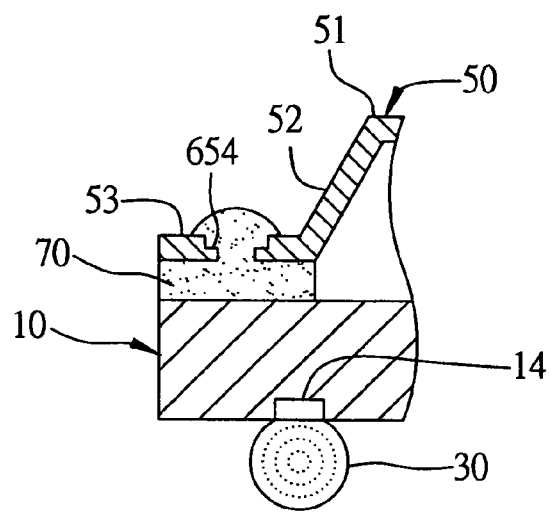
FIG. 7A  FIG. 7B
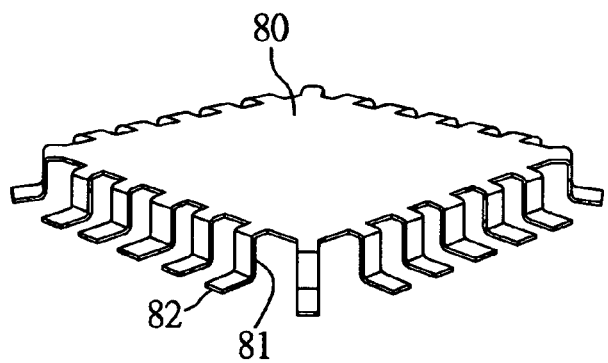
FIG. 8 (PRIOR ART)
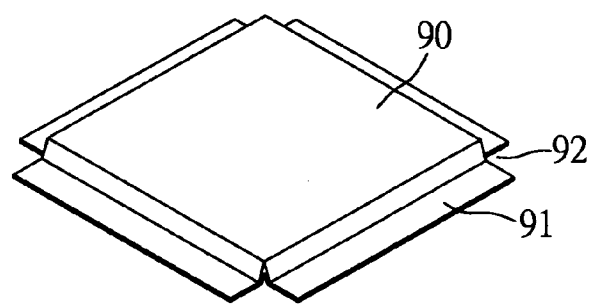
FIG. 9 (PRIOR ART)

SEMICONDUCTOR PACKAGE WITH HEAT SINK

FIELD OF THE INVENTION

The present invention relates to semiconductor packages, and more particularly, to a semiconductor package with a heat sink for improving efficiency of heat dissipation of the semiconductor package.

BACKGROUND OF THE INVENTION

Flip chip ball grid array (FCBGA) package is a type of semiconductor package having both the flip chip and ball grid array structure. In this type of package, at least one chip is electrically connected to one side of a substrate via a plurality of solder bumps, and a plurality of solder balls which act as input/output terminals are mounted on the other side of the substrate. A heat sink is usually provided in the foregoing package for dissipating heat generated from the chip during operation. For example, in U.S. Pat. Nos. 5,311,402 and 5,637,920, the heat sink is adhered onto the substrate via an adhesive or solder and often has a surface area larger than that of the chip, such that the heat sink disposed over the chip can effectively dissipate the heat from the chip. However, this structure yields significant drawbacks. The adhesion between the heat sink and the substrate may be degraded by undesirable cleanness of the bonding interface and the thermal stresses generated between the two, thereby leading to problems such as delamination between the heat sink and the substrate and detachment of the heat sink. External forces or shocks may also contribute to the detachment of heat sink. Moreover, the adhesion by means of the adhesive or solder is dependent on the effective bonding area or contact area between the heat sink and the substrate; however, it is undesirable to increase the bonding or contact area to improve the adhesion between the heat sink and the substrate in response to the trend of manufacturing smaller and lighter semiconductor packages.

Therefore, it has been disclosed to use a mechanical technique to mount the heat sink onto the substrate. In U.S. Pat. No. 5,907,474, a set of holes are formed in the heat sink at positions to be contact with the substrate, and another set of holes are formed in the substrate at positions corresponding to the holes of the heat sink, whereby fixing means such as screws can be coupled to corresponding pairs of the holes in the heat sink and substrate to thereby mechanically mount the heat sink on the substrate.

Most of the foregoing heat sinks are shaped to have recessed portions at central area thereof through the use of a half-etching or forge technique which is however complex and difficult to implement, thereby undesirably raising leading the fabrication costs.

Accordingly, U.S. Pat. No. 6,188,578 provides a stamping heat sink which is manufactured with relatively lower costs and simpler processes. As shown in FIG. 8, this stamping heat sink has a flat portion 80 to be disposed over the chip (not shown), a plurality of support portions 81 extending from edges of the flat portion 80 downwardly, and a laterally-extending contact portion 82 formed at the end of each support portion 81 to be in contact with the substrate (not shown).

However, when the above stamping heat sink is attached to the substrate via an adhesive or solder, the adhesion between the heat sink and the substrate may still be affected by the cleanness of bonding interface between the contact portions 82 and the substrate and by external forces or shocks. Besides, thermal stresses generated due to thermal mismatch between the contact portions 82 of the heat sink and the substrate may also lead to delamination between the heat sink and the substrate and more seriously the detachment of heat sink. Moreover, the bonding or contact area between the stamping heat sink and the substrate is decreased by virtue of the contact portions 82, which makes the heat sink further difficult to be firmly secured on the substrate in position.

In U.S. Pat. No. 6,376,907, as shown in FIG. 9, the heat sink similarly includes a flat portion 90 to be connected with the chip (not shown), and a peripheral bonding portion 91 extending downwardly and outwardly from the flat portion 90 to be in contact with the substrate (not shown). At the corners of the peripheral bonding portion 91 there are formed a plurality of openings 92 so as to alleviate the thermal stresses which may accumulate at the corners of the peripheral bonding portion 91.

If the peripheral bonding portion 91 of the heat sink, not having openings at the corners thereof, is directly attached to the substrate, due to mismatch in coefficient of thermal expansion (CTE) between the heat sink and the substrate, during subsequent reliability tests such as thermal cycling test (TCT), thermal shock test (TST), high temperature storage life test (HTST) and so on, the heat sink and the substrate would experience significant temperature changes and thus produce thermal stresses at bonding interface therebetween to thereby cause reliability issues. For examples, under an environment having an increasing temperature, the heat sink has a larger CTE and correspondingly generate greater deformation of thermal expansion than the substrate, thereby leading to thermal expansion stresses at the interface between the heat sink and the substrate. In a condition with a decreasing temperature, the heat sink having the larger CTE would generate greater deformation of thermal contraction than the substrate, resulting in thermal contraction stresses at the interface between the heat sink and the substrate. If these thermal stresses cannot be readily released, they would concentrate at area having uneven stress distribution such as the corners of the peripheral bonding portion 91, and undesirably facilitates the fatigue and structural damage of the bonding interface between the heat sink and the substrate at the corners of the peripheral bonding portion 91.

Therefore, the openings 92 formed at the corners of the peripheral bonding portion 91 of the heat sink allows the above-mentioned thermal stresses transmitted to the corners to be released through the openings 92, thereby helping solve the problem of the fatigue and structural damage of the bonding interface between the heat sink and the substrate at the corners of the peripheral bonding portion 91.

However, the provision of openings 92 at the corners of the bonding portion 91 still fails to remedy the deficiencies such as delamination at the interface between the heat sink and the substrate due to undesirable cleanness of the interface or external shocks. Moreover, the bonding portion 91 cannot effectively increase the bonding or contact area between the heat sink and the substrate, thereby difficult to improve the bonding strength between the heat sink and the substrate.

Therefore, the problem to be solved here is to provide a semiconductor package with a heat sink, which can overcome the above drawbacks and securely mount the heat sink on the substrate.

SUMMARY OF THE INVENTION

A primary objective of the present invention is to provide a semiconductor package with a heat sink, in which a plurality of slots are respectively formed through corners of the heat sink where the heat sink is to be attached to a substrate, and allows an adhesive material to be filled in the slots to provide an anchoring effect and thus firmly mount the heat sink on the substrate.

Another objective of the invention is to provide a semiconductor package with a heat sink, in which a plurality of slots are respectively formed through corners of the heat sink to effectively alleviate and release thermal stresses accumulated at the corners.

A further objective of the invention is to provide a semiconductor package with a heat sink, which can effectively increase contact area between an adhesive material and the heat sink mounted on a substrate via the adhesive material, to thereby improve the bonding strength between the heat sink and the substrate.

In order to achieve the foregoing and other objectives, the present invention proposes a semiconductor package with a heat sink, comprising: a substrate having a top surface and an opposite bottom surface; at least one chip disposed on the top surface of the substrate and electrically connected to the substrate via a plurality of conductive elements; a heat sink mounted on the top surface of the substrate and connected to the chip, wherein the heat sink comprises a flat portion attached to the chip, a support portion extending from edge of the flat portion to the substrate, and a bonding portion extending laterally from an end, extending to the substrate, of the support portion, allowing the flat portion to be supported and elevated above the chip by the support portion, and allowing the bonding portion to be attached to the top surface of the substrate, with slots formed through corners of the bonding portion; an adhesive material applied between the bonding portion of the heat sink and the top surface of the substrate and filled in the slots through the corners of the bonding portion with an overflow of the adhesive material out of the slots, so as to attach the heat sink to the substrate by means of the adhesive material; and a plurality of solder balls mounted on the bottom surface of the substrate.

The foregoing semiconductor package has a primary benefit that the provision of slots formed in the bonding portion of in the heat sink allows the adhesive material to be applied between the heat sink and the substrate and filled in and overflow out of the slots, such that the adhesive material can provide an anchoring effect to improve the bonding strength between the heat sink and the substrate and firmly mount the heat sink on the substrate. Moreover, the provision of slots allows bonding or contact surface between the adhesive material filled in the slots and the bonding portion of the heat sink to be increased, thereby further enhancing the bonding strength between the heat sink and the substrate.

As such, the prior-art problems such as delamination at the interface between the heat sink and the substrate and the detachment of heat sink due to poor cleanness of the interface or by external forces and shocks can be solved. Moreover, thermal stresses generated between the heat sink and the substrate can be alleviated and released via the slots at the corners of the heat sink, thereby preventing thermal stresses from concentrating at the corners of the heat sink and damaging the heat sink.

Furthermore, with the provision of slots, the adhesive can be overflowed, thereby increasing the bonding surface as well as the bonding strength between the heat sink and the substrate.

BRIEF DESCRIPTION OF THE DRAWINGS

The present invention can be more fully understood by reading the following detailed description of the preferred embodiments, with reference made to the accompanying drawings, wherein:

FIG. 7A is a schematic diagram showing an example of a slot formed in the heat sink according to the invention;

FIG. 7B is a schematic diagram showing another example of the slot formed in the heat sink according to the invention;

FIG. 8 (PRIOR ART) is a schematic diagram of a conventional heat sink; and

FIG. 9 (PRIOR ART) is a schematic diagram of another conventional heat sink.

DETAILED DESCRIPTION OF THE PREFERRED EMBODIMENTS

The preferred embodiments of a semiconductor package with a heat sink proposed in the present invention are described with reference to FIGS. 1 to 7.

Figure 1:
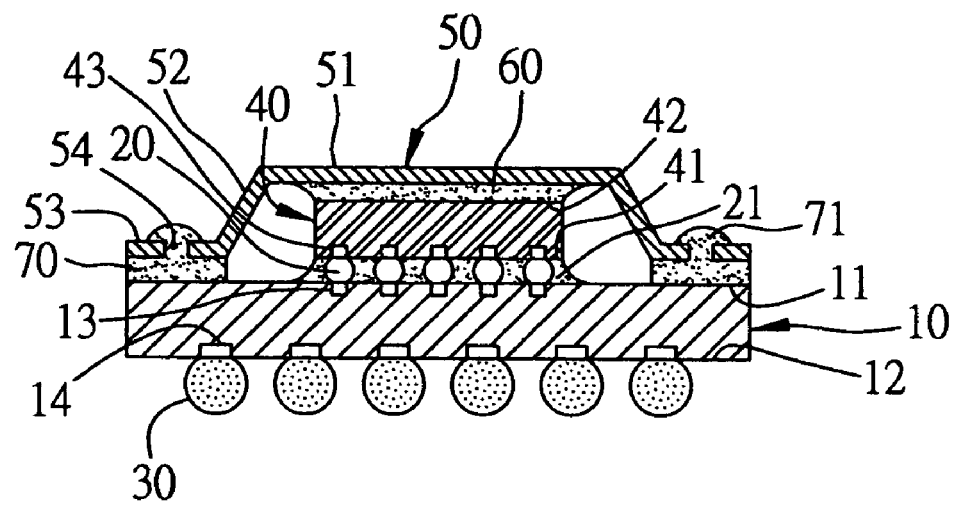
FIG. 1 is a cross-sectional view of a semiconductor package according to a preferred embodiment of the invention.

As shown in FIG. 1, the semiconductor package according to the invention utilizes a substrate 10 as a chip carrier. The substrate 10 is made of a conventional resin material such as epoxy resin, polyimide resin, BT (bismaleimide triazine) resin, FR4 resin, etc.

The substrate 10 has a top surface 11 and a bottom surface 12 opposite to the top surface 11. A plurality of bond pads 13 are formed at predetermined positions on the top surface 11 of the substrate 10 for mounting with solder bumps 20, and a plurality of ball pads 14 are formed on the bottom surface 12 of the substrate 10 for bonding with solder balls 30. Fabrication of the substrate 10 employs conventional technology and is not to be further discussed herein.

A chip 40 has an active surface 41 on which electronic elements and circuits (not shown) are formed, and a non-active surface 42 opposite to the active surface 41. A plurality of bond pads 43 are formed on the active surface 41 of the chip 40 and corresponding in position to the bond pads 13 on the substrate 10. The active surface 41 of the chip 40 is attached and electrically connected to the top surface 11 of the substrate 10 via the solder bumps 20 each of which has its two ends respectively bonded to the corresponding pair of bond pads 13, 43. This type of structure using conductive elements such as solder bumps to connect a chip and a substrate is customarily referred to as flip-chip structure, whose primary advantage is that an electrical pathway between the chip and the substrate can be effectively shortened by means of the solder bumps to thereby improve the quality of electrical connection.

An insulating material 21 such as resin can be applied between the chip 40 and the substrate 10 to fill up gaps between the adjacent solder bumps 20 and encapsulate the solder bumps 20. This gap-filling technique can desirably improve the bonding strength between the chip 40 and the substrate 10, and is customarily referred to as underfill technique, which can be implemented by for example dispensing the insulating material that would fill up the gaps between adjacent solder bumps via capillarity. The underfill technique is well known in the art and not to be further described herein.

A heat sink 50 is disposed on the top surface 11 of the substrate 10 and the non-active surface 42 of the chip 40. An adhesive such as thermally conductive adhesive 60 is used to attach the heat sink 50 to the chip 40, making the chip 40 covered and protected by the heat sink 50 against damage from external moisture or contaminants. The heat sink 50 functions to dissipate heat generated from the chip 40 during operation and transmitted via the thermally conductive adhesive 60, thereby improving heat dissipating efficiency of the semiconductor package.

Figure 2:
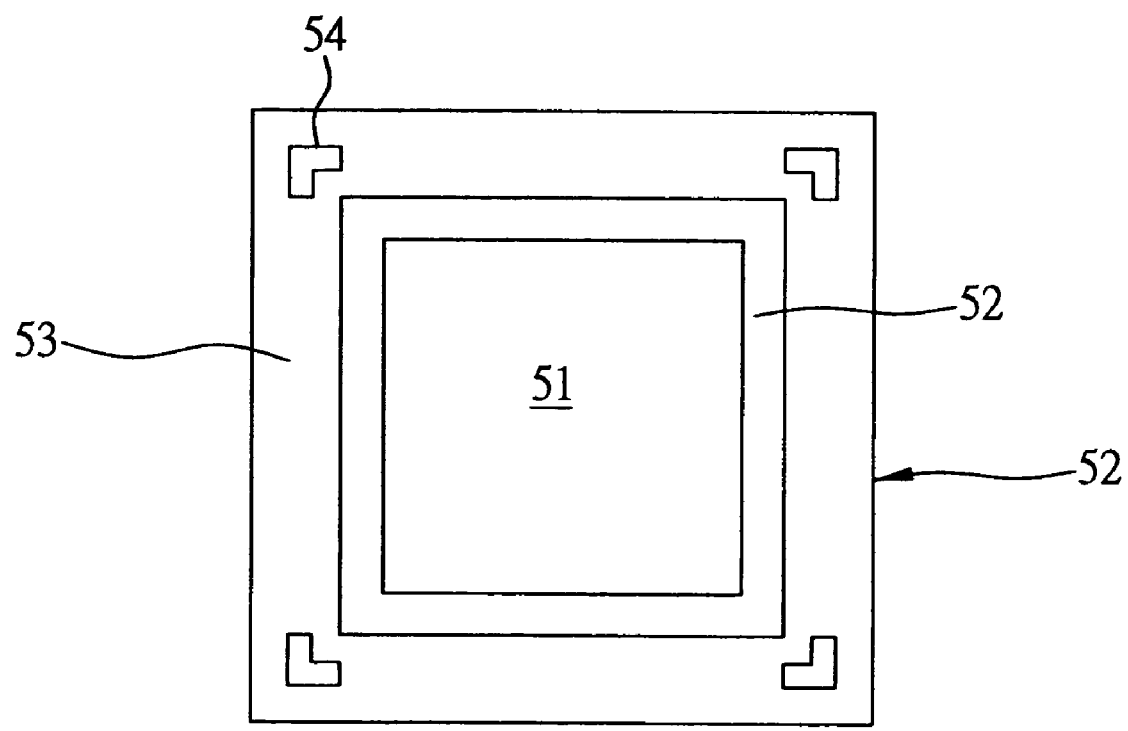
FIG. 2 is a top view of a heat sink used in the semiconductor package shown in FIG. 1.
Figure 3:
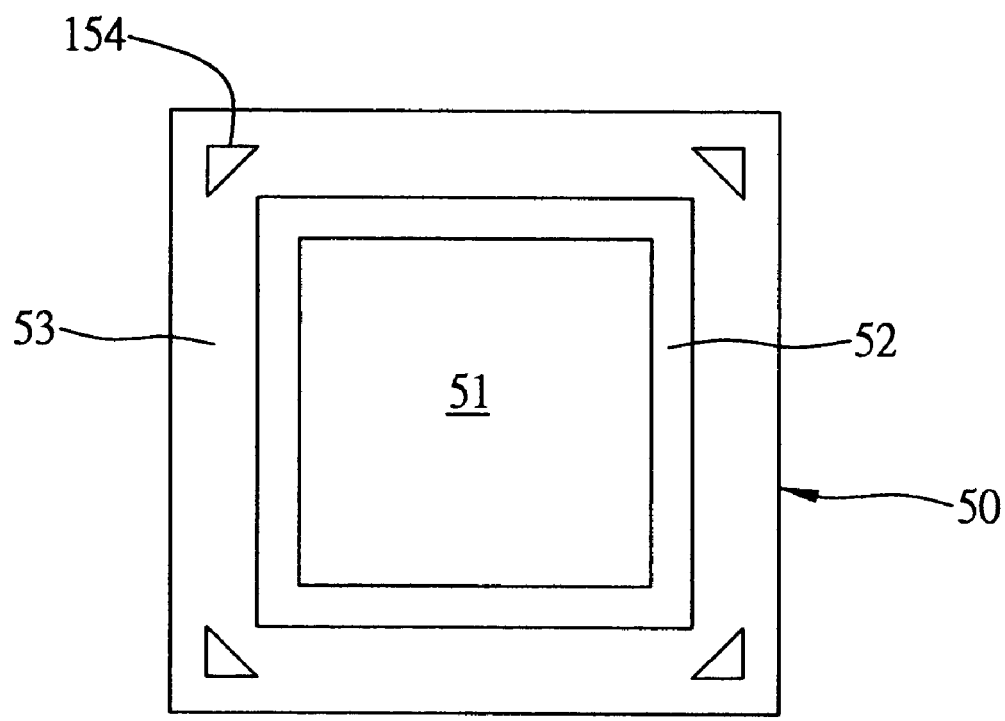
FIG. 3 is a top view of the heat sink according to another preferred embodiment of the invention.
Figure 4:
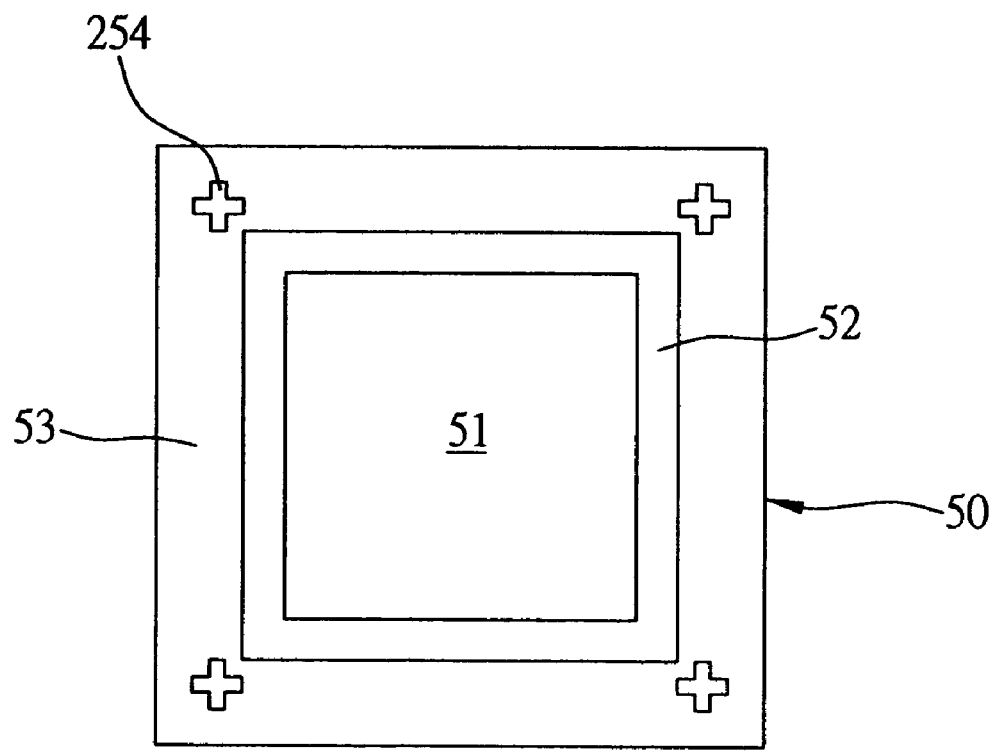
FIG. 4 is a top view of the heat sink according to a further preferred embodiment of the invention.
Figure 5:
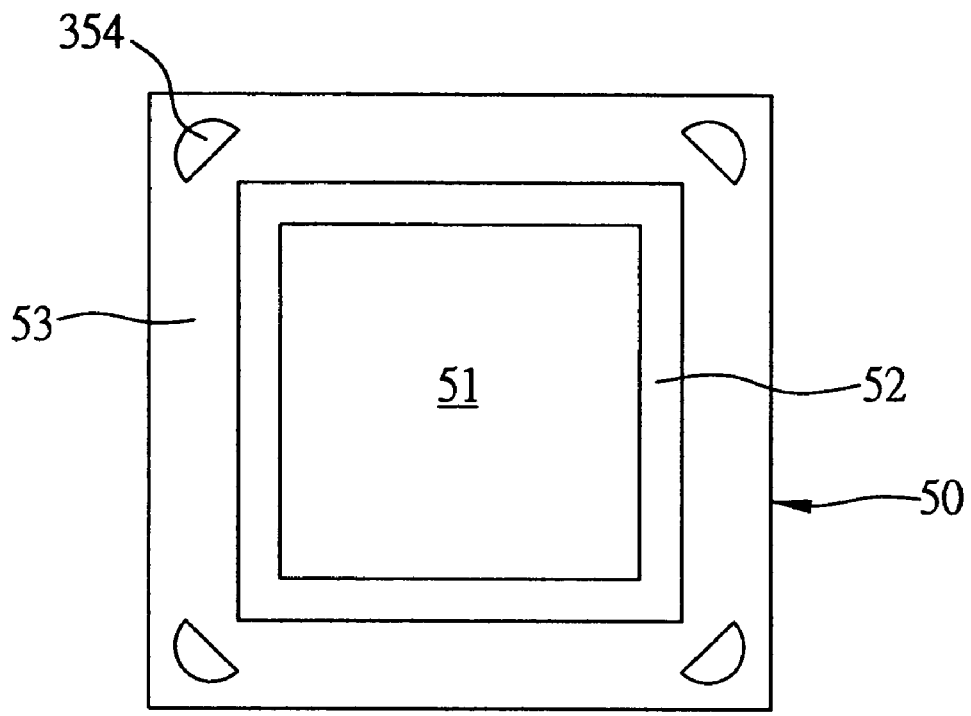
FIG. 5 is a top view of the heat sink according to a further preferred embodiment of the invention.
Figure 6:
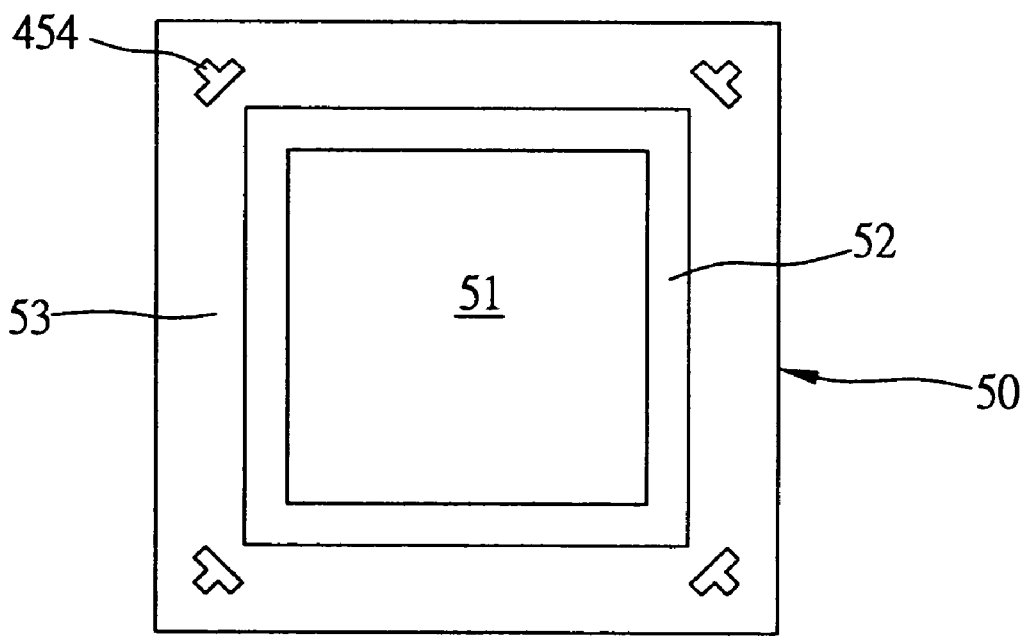
FIG. 6 is a top view of the heat sink according to a further preferred embodiment of the invention.

The heat sink 50 can be made by stamping a conductive material to form a flat portion 51, a support portion 52 extending from edge of the flat portion 51 to the substrate 10, and a bonding portion 53 extending laterally from an end, extending to the substrate 10, of the support portion 52. The flat portion 51 is supported and elevated above the chip 40 by the support portion 52, and the heat sink 50 is attached to the top surface 11 of the substrate 10 via the bonding portion 53. As shown in FIG. 2, there is a L-shaped slot 54 (in a horizontal sectional or top view thereof) formed through each corner or at least one corner of the bonding portion 53, making a portion of the top surface 11 of the substrate 10 exposed to the slots 54. An adhesive material 70 such as adhesive or solder is applied between the bonding portion 53 of the heat sink 50 and the top surface 11 of the substrate 10, and by applying a certain pressing force, the adhesive material 70 is filled in the slots 54 and overflows out of the slots 54. A curing step is followed to cure the adhesive material 70. Since the slots 54 of the bonding portion 53 of the heat sink 50 are exposed outside before applying the adhesive material 70, it is easy to control the amount of adhesive material 70 being used. When the adhesive material 70 overflows out of the slots 54, it indicates that a sufficient amount of adhesive material 70 is applied in the slots 54 and between the bonding portion 53 of the heat sink 50 and the substrate 10, such that no more adhesive material 70 is required. Further as shown in FIG. 1, the cured adhesive material 70 filled in and overflowing out of the slots 54 forms a rivet-shaped structure 71 which can provide an anchoring effect to firmly mount the heat sink 50 on the substrate 10.

A plurality of solder balls 30 are implanted at the ball pads 14 formed on the bottom surface 12 of the substrate 10. The solder balls 30 act as input/output terminals to be electrically connected with an external device such as printed circuit board (not shown), such that the chip 40 can be electrically coupled to the external device via the solder balls 30 for operation.

By the provision of the foregoing slots 54 formed at the corners of the bonding portion 53 of the heat sink 50, the adhesive material 70 which is applied between the heat sink 50 and the substrate 10 and over filled in the slots 54 can provide an anchoring effect to firmly secure the heat sink 50 on the substrate 10 in position. Further, the slots 54 desirably allows bonding or contact surface between the adhesive material 70 filled in the slots 54 and the bonding portion 53 of the heat sink 50 to be increased, thereby effectively enhancing the bonding strength between the heat sink 50 and the substrate 10. As a result, the prior-art problems such as delamination at the interface between the heat sink and the substrate and the detachment of heat sink from the substrate can be solved. Moreover, the slots 54 situated at the corners of the bonding portion 53 can alleviate and release thermal stresses that are generated between the bonding portion 53 and the substrate 10 due to temperature changes and transmitted to the corners of the bonding portion 53 of the heat sink 50, thereby preventing the occurrence of detachment of a conventional heat sink having thermal stresses concentrated at corners thereof.

The slot 54 formed through the bonding portion 53 of the heat sink 50 is not limited to the L-shape shown in FIG. 2, but can also be fabricated (in a horizontal sectional or top view thereof) as a triangular-shaped slot 154 (FIG. 3), a cross-shaped slot 254 (FIG. 4), a hemispherical-shaped slot 354 (FIG. 5), or a T-shaped slot 454 (FIG. 6), or any other appropriate shape that would also achieve the same results or improvements.

Moreover, an inner wall of any of the above slots 54, 154, 254, 354, 454 can be configured to form a taper structure 554 shown in FIG. 7A or bent to form a stepped structure 654 shown in FIG. 7B, or any other configuration that can both enhance the surface area of the inner wall of the slot and the adhesion between the adhesive material 70 and the inner wall of the slot, to thereby further enhance the bonding or contact area between the adhesive material 70 and the bonding portion 53 and to improve the bonding strength between the heat sink 50 and the substrate 10.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat sink, comprising:
   a substrate having a top surface and an opposite bottom surface;
   at least one chip disposed on the top surface of the substrate and electrically connected to the substrate via a plurality of conductive elements;
   a heat sink mounted on the top surface of the substrate and connected to the chip, wherein the heat sink has a top surface and an opposite bottom surface and comprises a flat portion attached to the chip, a support portion extending from an edge of the flat portion to the substrate, and a bonding portion extending laterally from an end of the support portion and connected to the substrate, allowing the flat portion to be supported and elevated above the chip by the support portion, and allowing the bonding portion to be attached to the top surface of the substrate, with at least one slot formed through at least one corner of the bonding portion to expose the top surface of the substrate, the slot comprising a through hole penetrating the top and bottom surfaces of the bonding portion of the heat sink, and the slot having at least one of a taper structure and a bent inner wall;
   an adhesive material applied between the bonding portion of the heat sink and the top surface of the substrate and filled in the slot through the corner of the bonding portion with an overflow of the adhesive material out of the slot, so as to attach the heat sink to the substrate by means of the adhesive material; and a plurality of solder balls mounted on the bottom surface of the substrate.

2. The semiconductor package of claim 1, wherein the adhesive material is an adhesive.

3. The semiconductor package of claim 1, wherein the adhesive material is solder.

4. The semiconductor package of claim 1, wherein the substrate is made of a material selected from the group consisting of epoxy resin, polyimide, BT (bismaleimide triazine) resin, and FR4 resin.

5. The semiconductor package of claim 1, wherein the chip has an active surface and an opposite non-active surface, allowing the plurality of conductive elements to be bonded to the active surface of the chip and the top surface of the substrate to electrically connect the chip to the substrate.

6. The semiconductor package of claim 5, wherein the conductive elements are solder bumps.

7. The semiconductor package of claim 6, wherein an insulating material is applied between the chip and the substrate to fill up gaps between the adjacent solder bumps.

8. The semiconductor package of claim 1, wherein the heat sink is made by stamping a thermally conductive material.

9. The semiconductor package of claim 1, wherein the flat portion of the heat sink is attached to the chip via an adhesive.

10. The semiconductor package of claim 9, wherein the adhesive is a thermally conductive adhesive.

11. The semiconductor package of claim 1, wherein the adhesive material filled in the slot is shaped as a rivet to provide an anchoring effect.

12. The semiconductor package of claim 1, wherein the slot is of a L-shape in a horizontal sectional view thereof.

13. The semiconductor package of claim 1, wherein the slot is of a triangular shape in a horizontal sectional view thereof.

14. The semiconductor package of claim 1, wherein the slot is of a cross shape in a horizontal sectional view thereof.

15. The semiconductor package of claim 1, wherein the slot is of a hemispherical shape in a horizontal sectional view thereof.

16. The semiconductor package of claim 1, wherein the slot is of a T-shape in a horizontal sectional view thereof.

17. The semiconductor package of claim 1, wherein the inner wall of the slot is bent to form a stepped structure.

* * * * *